US009704947B2

(12) United States Patent
Ebihara et al.

(10) Patent No.: US 9,704,947 B2
(45) Date of Patent: Jul. 11, 2017

(54) SEMICONDUCTOR DEVICE AND METHOD FOR MANUFACTURING SAME

(71) Applicant: Mitsubishi Electric Corporation, Chiyoda-ku (JP)

(72) Inventors: Kohei Ebihara, Tokyo (JP); Naruhisa Miura, Tokyo (JP); Kenji Hamada, Tokyo (JP); Koji Okuno, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/890,557

(22) PCT Filed: May 2, 2014

(86) PCT No.: PCT/JP2014/062129
§ 371 (c)(1),
(2) Date: Nov. 11, 2015

(87) PCT Pub. No.: WO2014/208201
PCT Pub. Date: Dec. 31, 2014

(65) Prior Publication Data
US 2016/0087031 A1   Mar. 24, 2016

(30) Foreign Application Priority Data

Jun. 27, 2013 (JP) .................................. 2013-134443

(51) Int. Cl.
*H01L 29/06* (2006.01)
*H01L 29/66* (2006.01)
(Continued)

(52) U.S. Cl.
CPC ...... *H01L 29/0619* (2013.01); *H01L 21/0465* (2013.01); *H01L 21/765* (2013.01);
(Continued)

(58) Field of Classification Search
CPC ... H01L 29/0619; H01L 29/06; H01L 29/861; H01L 29/868; H01L 21/765;
(Continued)

(56) References Cited

U.S. PATENT DOCUMENTS 8,232,593 B2   7/2012   Saito et al.
8,343,861 B2   1/2013   Mabuchi
(Continued)

FOREIGN PATENT DOCUMENTS

JP    5-259159 A    10/1993
JP    10-319598 A   12/1998
(Continued)

OTHER PUBLICATIONS

International Preliminary Report on Patentability and Written Opinion of the International Searching Authority issued on Jan. 7, 2016 in PCT/JP2014/062129 with English translation.
(Continued)

*Primary Examiner* — Fernando L Toledo
*Assistant Examiner* — Adam S Bowen
(74) *Attorney, Agent, or Firm* — Oblon, McClelland, Maier & Neustadt, L.L.P.

(57) ABSTRACT

A semiconductor device including a terminal region that can suppress a resist collapse in manufacturing and effectively relieve a concentration of electric fields and a method for manufacturing the semiconductor device. The semiconductor device includes a semiconductor element formed in a semiconductor substrate made of a silicon carbide semiconductor of a first conductivity type and a plurality of ring-shaped regions of a second conductivity type formed in the semiconductor substrate while surrounding the semiconductor element in plan view. At least one of the plurality of ring-shaped regions includes one or more separation regions of the first conductivity type that cause areas of the first
(Continued)

conductivity type on an inner side and an outer side of one of the ring-shaped regions to communicate with each other in plan view.

9 Claims, 11 Drawing Sheets

(51) Int. Cl.
*H01L 29/872* (2006.01)
*H01L 29/16* (2006.01)
*H01L 21/04* (2006.01)
*H01L 21/765* (2006.01)

(52) U.S. Cl.
CPC ...... *H01L 29/1608* (2013.01); *H01L 29/6606* (2013.01); *H01L 29/872* (2013.01); *H01L 29/0692* (2013.01)

(58) Field of Classification Search
CPC ............. H01L 21/0465; H01L 29/1608; H01L 29/6606; H01L 29/872; H01L 29/0692; G03F 1/70
USPC .......................................................... 257/77
See application file for complete search history.

(56) References Cited

U.S. PATENT DOCUMENTS

| | | | |
|---|---|---|---|
| 2004/0023133 A1 | 2/2004 | Shimbori et al. | |
| 2010/0289110 A1* | 11/2010 | Tarui | H01L 29/0619 257/490 |
| 2012/0049187 A1* | 3/2012 | Haruyama | H01L 29/866 257/49 |
| 2012/0256192 A1 | 10/2012 | Zhang et al. | |
| 2014/0077329 A1* | 3/2014 | Abe | H01L 29/404 257/488 |
| 2014/0162413 A1 | 6/2014 | Wakimoto et al. | |

FOREIGN PATENT DOCUMENTS

| | | | |
|---|---|---|---|
| JP | 11-26436 A | 1/1999 | |
| JP | 11-87691 A | 3/1999 | |
| JP | 2004-64025 A | 2/2004 | |
| JP | 2007-81174 A | 3/2007 | |
| JP | 2007-227620 A | 9/2007 | |
| JP | 2008-10506 A | 1/2008 | |
| JP | 2008-235422 A | 10/2008 | |
| JP | 2010-73902 A | 4/2010 | |
| JP | 2010-219224 A | 9/2010 | |
| JP | 2010-267655 | 11/2010 | |
| JP | 2011-171552 | 9/2011 | |
| JP | 2012-004312 | 1/2012 | |
| JP | 2012-178412 | 9/2012 | |
| JP | 2012-248736 | 12/2012 | |
| JP | 2013-258287 A | 12/2013 | |
| WO | 2013/011548 A1 | 1/2013 | |
| WO | WO 2013/021727 A1 | 2/2013 | |

OTHER PUBLICATIONS

International Search Report Issued Jul. 22, 2014 in PCT/JP14/062129 Filed May 2, 2014.
Office Action issued Jul. 12, 2016 in Japanese Patent Application No. 2015-523910 (with partial English translation).
Office Action issued Jan. 17, 2017, in Japanese Patent Application No. 2015-523910 (with partial English language translation).
Japanese Office Action issued May 16, 2017 in Japanese Application No. 2015-523910, with Partial English translation, (5 pages).

* cited by examiner (a)

(b)

(a)

(b)

SEMICONDUCTOR DEVICE AND METHOD FOR MANUFACTURING SAME

TECHNICAL FIELD

The present invention relates to a semiconductor device including a semiconductor element having a vertical structure, such as a diode, a metal oxide semiconductor field effect transistor (MOSFET), and an insulated gate bipolar transistor (IGBT).

BACKGROUND ART

For application of voltage to a semiconductor device, depletion layers are formed in an active region that actively functions as a semiconductor element, and a concentration of electric fields occurs at a boundary between the depletion layers, thereby decreasing withstand voltage of the semiconductor device. Thus, a terminal region of a conductivity type opposite to a conductivity type of a semiconductor layer is provided on an outer peripheral side of the active region, so that a p-n junction between the semiconductor layer and the terminal region causes the depletion layers to spread, and the concentration of electric fields is relieved, which allows for an increase in the withstand voltage of the semiconductor device.

A field limiting ring (FLR) structure including a plurality of ring-shaped implantation regions that surround an active region is widely applied to conventional semiconductor devices, as a structure of a terminal region that increases withstand voltage of the semiconductor devices. In the FLR structure, an interval between the rings gradually increases toward an outer peripheral side of the semiconductor devices to gradually reduce an impurity concentration per unit area toward the outer peripheral side, thereby producing semiconductor devices that can obtain high withstand voltage by effectively relieving electric fields (see Patent Document 1, for example).

PRIOR ART DOCUMENT

Patent Document

Patent Document 1: Japanese Patent Application Laid-Open No. 2008-10506

SUMMARY OF INVENTION

Problems to be Solved by the Invention

For such semiconductor device, the intervals between the rings around an inner periphery need to be designed to be extremely close in order to obtain high withstand voltage. Thus, an extremely elongated resist of a ring shape having an approximately submicron to micron line width needs to be formed as an ion-implantation mask for forming the FLR structure, the resist surrounding the active region of the semiconductor device. The resist having the thin line width often collapses during a process (hereinafter, this phenomenon is referred to as a "resist collapse"), thereby hardly obtaining the FLR structure as designed. Moreover, the intervals between the rings in the FLR structure are made close to obtain the semiconductor device having higher withstand voltage, but the line width of the resist is limited due to the problem of the resist collapse, and thus the problem arises that the intervals between the rings are limited.

The present invention has been made in view of the above mentioned problems, and an object thereof is to provide a semiconductor device including a terminal region that can suppress a resist collapse in manufacturing and effectively relieve a concentration of electric fields and to provide a method for manufacturing the semiconductor device.

Means to Solve the Problems

A semiconductor device of the present invention includes a semiconductor element formed in a semiconductor substrate made of a silicon carbide semiconductor of a first conductivity type and a plurality of ring-shaped regions of a second conductivity type formed in the semiconductor substrate while surrounding the semiconductor element in plan view. At least one of the plurality of ring-shaped regions includes one or more separation regions of the first conductivity type that cause areas of the first conductivity type on an inner side and an outer side of one of the ring-shaped regions to communicate with each other in plan view.

A method for manufacturing the semiconductor device of the present invention includes: (a) forming a semiconductor element in a semiconductor substrate made of a silicon carbide semiconductor of a first conductivity type; and (b) forming a plurality of ring-shaped regions at locations surrounding the semiconductor element in the semiconductor substrate in plan view. The (b) forming a plurality of ring-shaped regions includes: (b1) forming a plurality of resists of a ring shape on the semiconductor substrate surrounding the semiconductor element in plan view such that the plurality of resists are separated from each other and such that at least one of the resists is joined to another one of the resists adjacent to the at least one resist by a bridge having a predetermined width; and (b2) implanting ions into the semiconductor substrate using the resists as a mask.

Effects of the Invention

The semiconductor device of the present invention includes a semiconductor element formed in a semiconductor substrate made of a silicon carbide semiconductor of a first conductivity type and a plurality of ring-shaped regions of a second conductivity type formed in the semiconductor substrate while surrounding the semiconductor element in plan view. At least one of the plurality of ring-shaped regions includes one or more separation regions of the first conductivity type that cause areas of the first conductivity type on an inner side and an outer side of one of the ring-shaped regions to communicate with each other in plan view. Therefore, a resist collapse when the ring-shaped regions are formed can be suppressed, and a concentration of electric fields in a terminal region can be effectively relieved.

The method for manufacturing the semiconductor device of the present invention includes: (a) forming a semiconductor element in a semiconductor substrate made of a silicon carbide semiconductor of a first conductivity type; and (b) forming a plurality of ring-shaped regions at locations surrounding the semiconductor element in the semiconductor substrate in plan view. The (b) forming a plurality of ring-shaped regions includes: (b1) forming a plurality of resists of a ring shape on the semiconductor substrate surrounding the semiconductor element in plan view such that the plurality of resists are separated from each other and such that at least one of the resists is joined to another one of the resists adjacent to the at least one resist by a bridge having a predetermined width; and (b2) implanting ions into the semiconductor substrate using the resists as a mask. Therefore, in the (b1) forming a plurality of resists and the (b2) implanting ions into the semiconductor substrate, a semiconductor device capable of suppressing a resist collapse and effectively relieving a concentration of electric fields in a terminal region can be manufactured with high yields.

These and other objects, features, aspects and advantages of the present invention will become more apparent from the following detailed description of the present invention when taken in conjunction with the accompanying drawings.

DESCRIPTION OF EMBODIMENTS

A. Underlying Technology

First, a configuration of a Schottky diode being a semiconductor device of an underlying technology of the present invention is described. In the following descriptions, a semiconductor of a first conductivity type is described as a semiconductor of an n-type while a semiconductor of a second conductivity type is described as a semiconductor of a p-type, which are not restrictive, and the semiconductor of the first conductivity type may be a semiconductor of a p-type while the semiconductor of the second conductivity type may be a semiconductor of an n-type. Hereinafter, it is described that the present invention is applied to the Schottky diode that has a vertical structure and is made of silicon carbide (SiC), the Schottky diode being the semiconductor device, and another semiconductor material or another semiconductor device such as a metal oxide semiconductor field effect transistor (MOSFET) may also be used. Further, in the following descriptions, an "inner side" refers to an active region side being a center portion side of the semiconductor device while an "outer side" refers to a terminal region side being an outer edge side of the semiconductor device.

Figure 16:
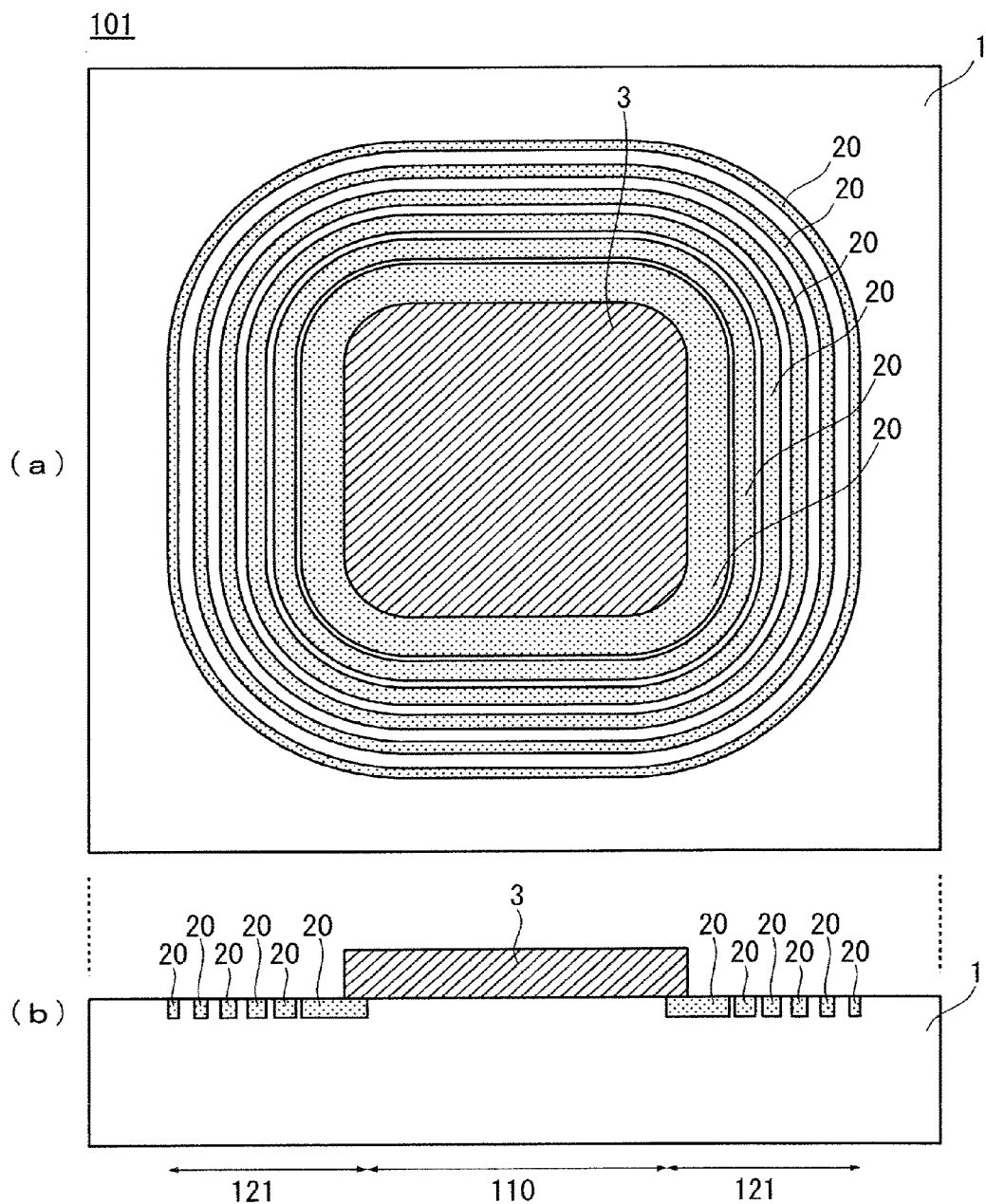
FIG. 16 is a plan view and a cross-sectional view showing a configuration of a semiconductor device of an underlying technology.

FIG. 16 is a diagram of a configuration of a Schottky diode 101 according to the preliminary underlying technology. Part (a) of FIG. 16 is a plan view of the Schottky diode 101, and part (b) of FIG. 16 is a cross-sectional view of the Schottky diode 101.

In parts (a) and (b) of FIG. 16, a semiconductor layer 1 of the n-type is provided on a semiconductor substrate of a 4H-SiC, which is not shown, and a metal electrode 3 is disposed on a surface of the semiconductor layer 1. A region of the semiconductor layer 1 located below the metal electrode 3 is an active region 110 that functions as an active element, and the outer side of the semiconductor layer 1 surrounding the active region 110 is a terminal region 121 for holding withstand voltage of the semiconductor device. An insulating surface protective film, which is not shown, is formed on a region of the terminal region 121. A plurality of FLRs 20 of the p-type separated from each other are formed in the terminal region 121, and as the interval between the FLRs 20 adjacent to each other increases toward the outer side of the semiconductor device, a concentration of electric fields in the terminal region 121 is effectively relieved, so that withstand voltage of the Schottky diode 101 can be increased.

Figure 17:
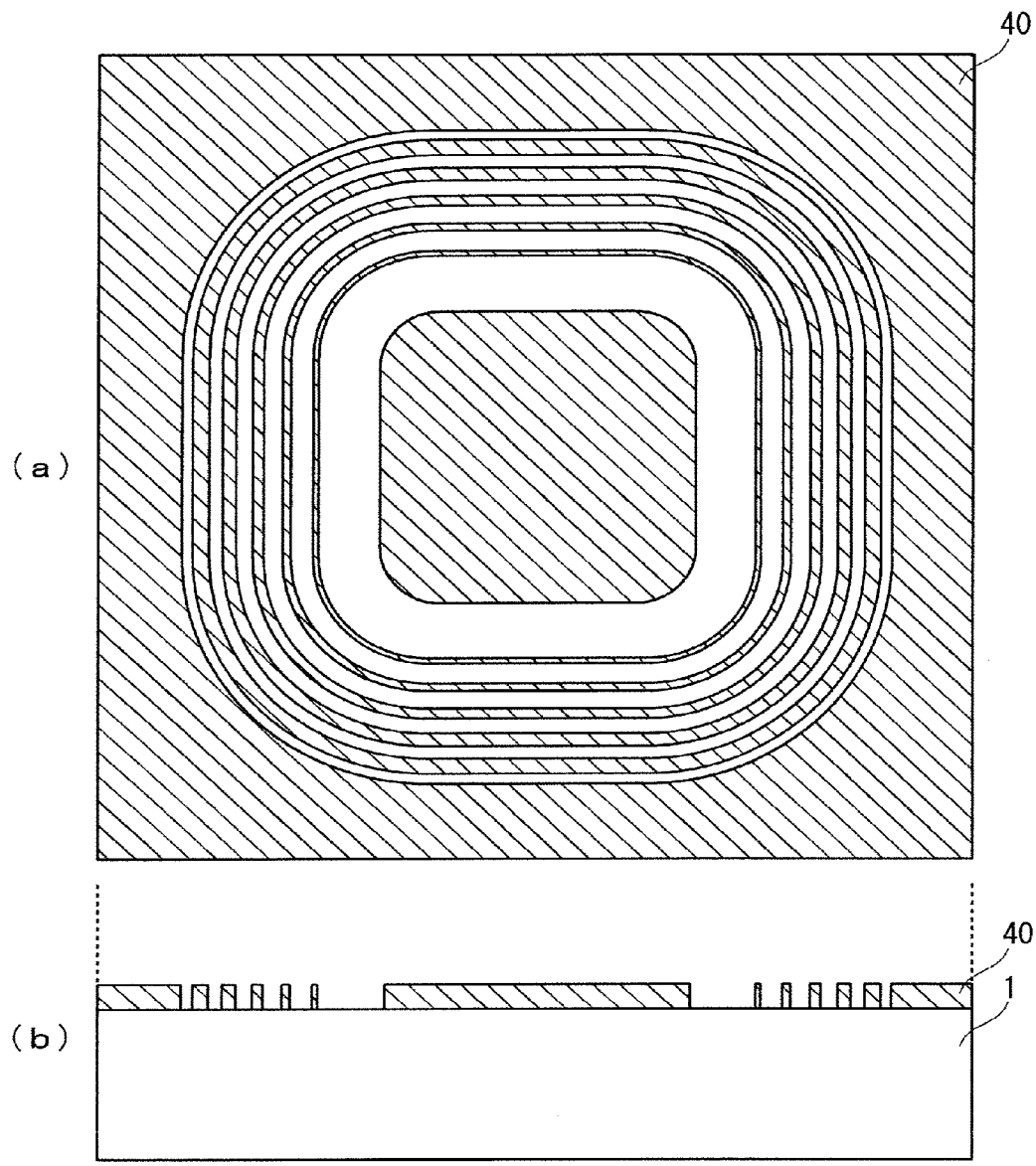
FIG. 17 is a plan view and a cross-sectional view showing a step for manufacturing the semiconductor device of the underlying technology.

FIG. 17 shows resists 40 for forming the FLRs 20. The FLRs 20 are formed by plantation of acceptor ions such as Al with the resists 40 as an implantation mask. At this time, the resists 40 need to have an extremely narrow line width to reduce an interval between the FLRs 20 close to the inner side of the terminal region 121. However, the narrow line width of the resists 40 easily collapses, and the desired Schottky diode 101 cannot be obtained by the ion implantation in the state in which the resists 40 collapse, thereby possibly resulting in a significant decrease in withstand voltage of the element. Moreover, reducing the interval between the FLRs 20 to further increase the withstand voltage of the element is hardly achieved due to the problem of the resist collapse.

To further increase the withstand voltage while avoiding the problem, a contrivance is needed to avoid the resist collapse. Thus, the present invention includes a configuration of each embodiment as shown below.

B. First Embodiment

<B-1. Configuration>

Figure 1:
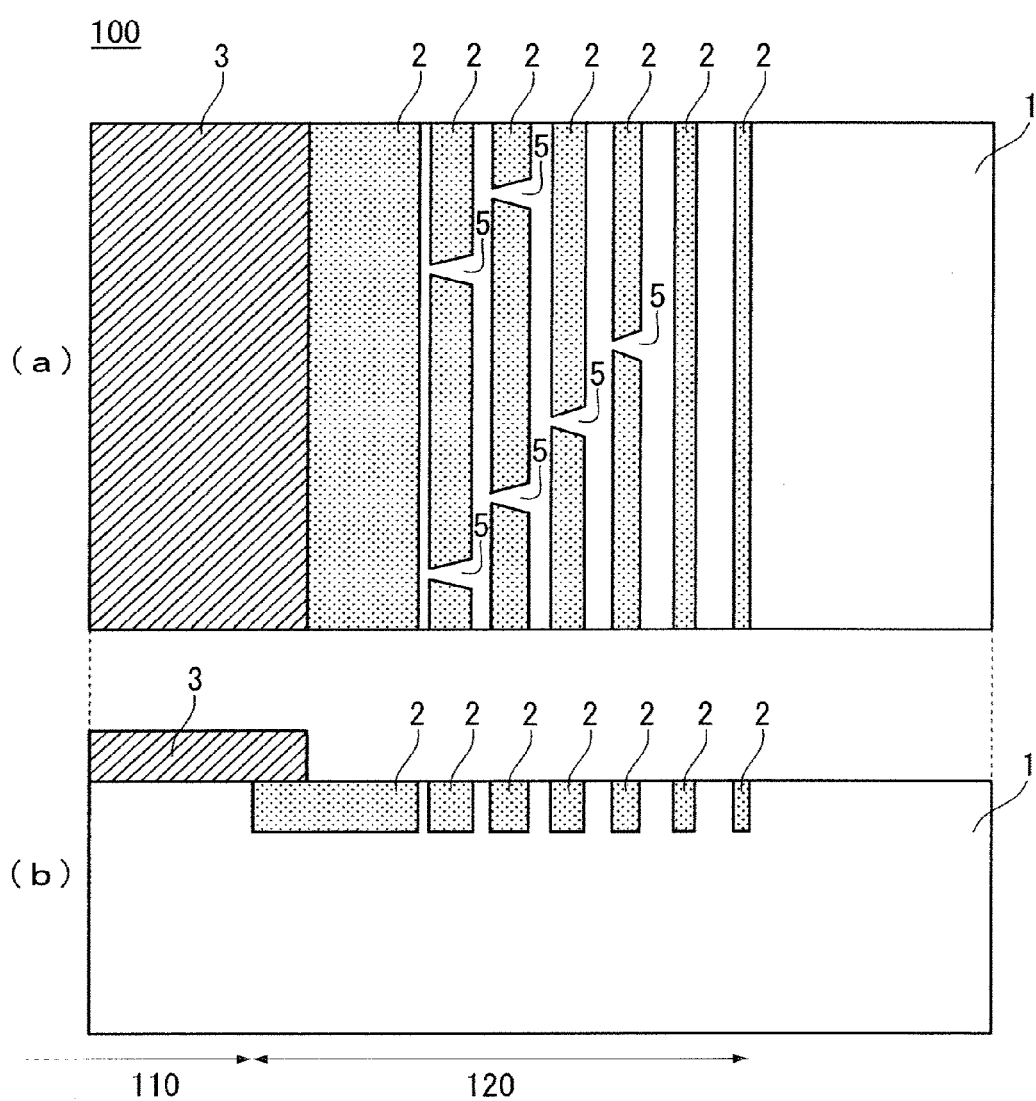
FIG. 1 is a plan view and a cross-sectional view showing a configuration of a semiconductor device according to a first embodiment.

FIG. 1 shows a configuration around a terminal region 120 provided on an outer side of a Schottky diode 100 being a semiconductor device according to a first embodiment. Part (a) of FIG. 1 shows a plan view, and part (b) of FIG. 1 shows a cross-sectional view.

The Schottky diode 100 includes a semiconductor substrate of a 4H-SiC, which is not shown, a semiconductor layer 1 of the n-type, a metal electrode 3, and FLRs 2 of the p-type. The semiconductor layer 1 is formed on the semiconductor substrate, and the metal electrode 3 is disposed on a surface of the semiconductor layer 1.

The semiconductor layer 1 is divided into an active region 110 that functions as an active element below the metal electrode 3 and a terminal region 120 that surrounds the active region 110. An insulating surface protective film, which is not shown, is formed on a region of the terminal region 120. Furthermore, the plurality of FLRs 2 of the p-type separated from each other are formed in a surface layer of the semiconductor layer 1 in the terminal region 120. An interval at which the FLRs 2 are disposed increases toward the outer side of the Schottky diode 100, so that a concentration of electric fields in the terminal region 120 is effectively relieved, thereby improving withstand voltage.

The FLRs 2 are formed in a ring shape in the terminal region 120 while surrounding the active region 110. However, each of the FLRs 2 formed in the inner side of the terminal region 120 does not have a completely continuing ring shape and includes one or more separation regions 5. The separation regions 5 cause an inner peripheral side and an outer peripheral side of the FLR 2 of the ring shape to communicate with each other in plan view. A separation width of the separation regions 5 is formed narrower on the inner peripheral side of the FLR 2 and wider on the outer peripheral side thereof. In addition, the separation regions 5 do not need to be formed in all of the FLRs 2, but the separation regions 5 are formed in the FLRs 2 disposed at close intervals on the inner side of the terminal region 120.

<B-2. Resist>

Figure 2:
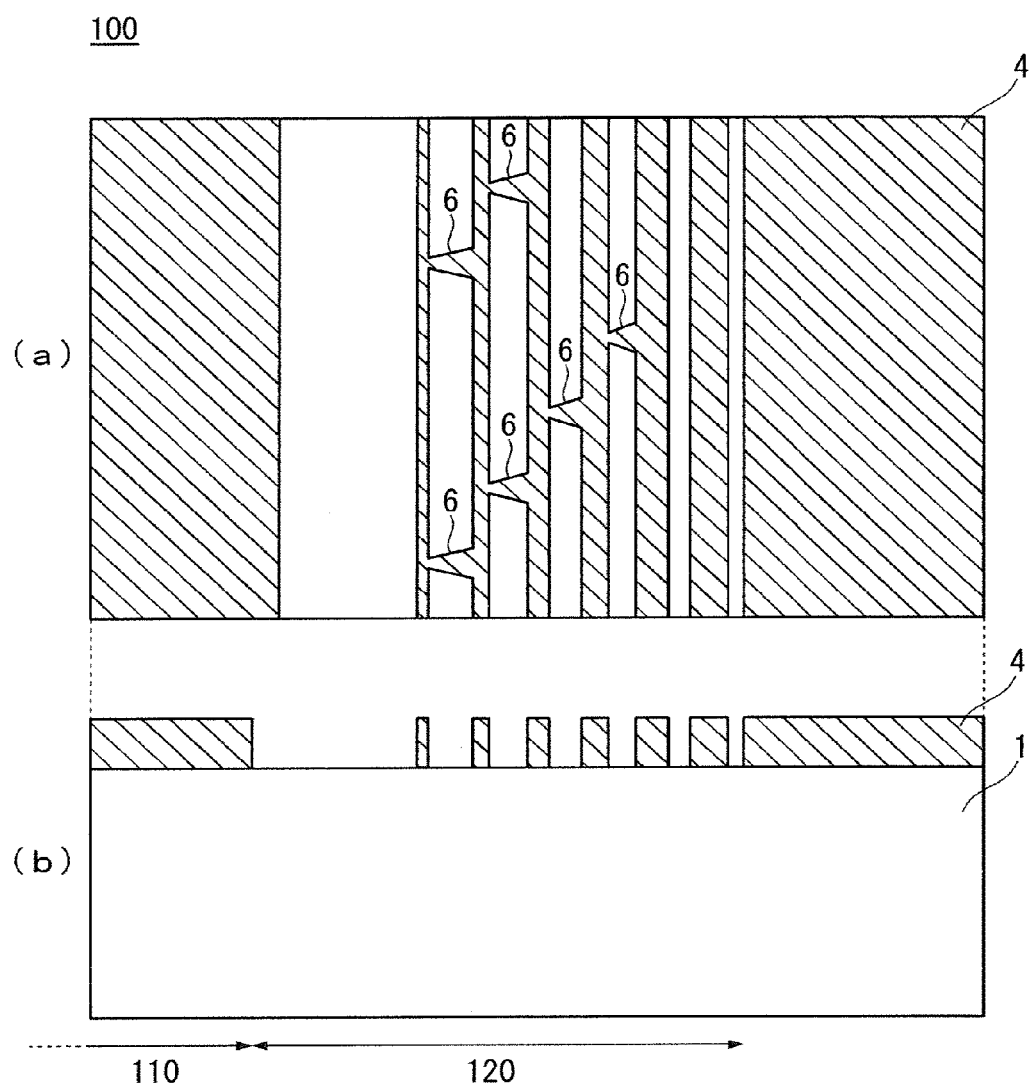
FIG. 2 is a plan view and a cross-sectional view showing a step for manufacturing the semiconductor device according to the first embodiment.

FIG. 2 shows resists 4 for forming the FLRs 2 of the Schottky diode 100 shown in FIG. 1. Part (a) of FIG. 2 is a plan view of a state in which the resists 4 are formed on the semiconductor layer 1, and part (b) of FIG. 2 is a cross-sectional view thereof. The FLRs 2 are formed by an implantation of acceptor ions such as Al with the resists 4 as an implantation mask. The resists 4 include a portion that covers the active region 110 of the semiconductor layer 1, a portion that covers the outside of the terminal region 120, and a portion formed on the terminal region 120 to form the FLRs 2. The resists 4 formed on the terminal region 120 have bridges 6 corresponding to the separation regions 5 of the FLRs 2 that need to be formed, and the resists 4 of a ring shape adjacent to each other are joined by the bridges 6.

The bridges 6 are each formed so as to have a thin width on the inner side and a wider width toward the outer side. One of the resists 4 that is formed on the inner side of the terminal region 120 and that has the thin line width is joined to another one of the resists 4 adjacent to the resist 4 by the bridges 6, thereby suppressing the resist collapse.

Figure 3:
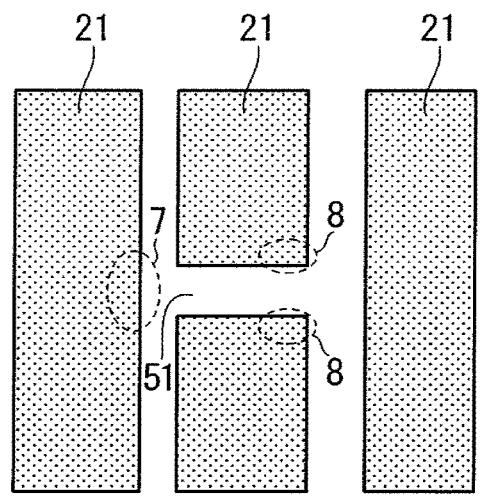
FIG. 3 is a plan view showing an FLR structure of a comparative example.
Figure 5:
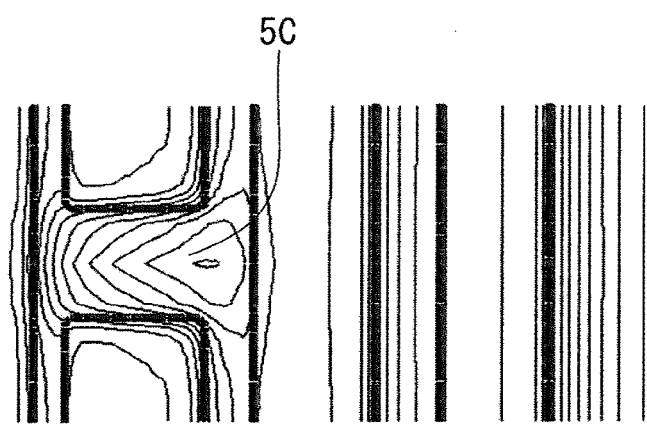
FIG. 5 is a diagram showing potential distribution in the FLR structures of the comparative example and the first embodiment.
Figure 5:
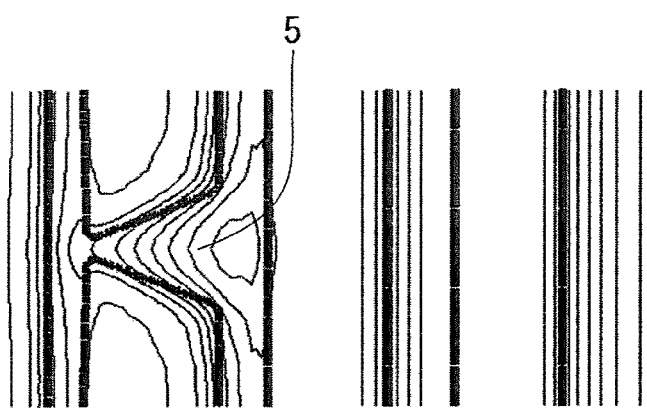

Strength for supporting such that the resists 4 do not collapse increases as the width of the bridges 6 increases. Then, the bridges 6 have an equal width on the inner side and the outer side, which is considered as a comparative example. FIG. 3 shows a separation region 51 of one of FLRs 21 formed with a resist of the comparative example, and part (a) of FIG. 5 shows a result of a simulation of potential distribution thereof. In addition, the separation region 51 has a width of 4 µm in part (a) of FIG. 5. As seen from part (a) of FIG. 5, electric fields are abruptly increased at electric field concentrated points 7, 8 shown in FIG. 3 of the FLRs 21 including the separation region 51 having the equal width.

Figure 4:
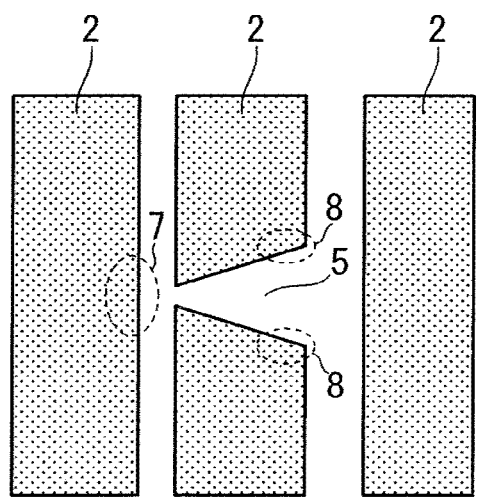
FIG. 4 is a plan view showing an FLR structure of the first embodiment.

On the other hand, the separation region 5 in one of the FLRs 2 formed with the resists 4 in the first embodiment increases from the inner peripheral side toward the outer peripheral side of the FLR 2 as shown in FIG. 4. Part (b) of FIG. 5 shows a result of a simulation of potential distribution of the FLRs 2. For example, the separation region 5 has a width of 1 µm on the smallest inner peripheral side of the FLR 2 and has a width of 4 µm on the widest outer peripheral side of the FLR 2. As seen from part (b) of FIG. 5, a concentration of electric fields at the electric field concentrated points 7, 8 of the FLRs 2 in the first embodiment is more relieved than that in the comparative example.

As shown above, the bridges 6 of the resists 4 in the first embodiment are narrow on the inner side and wide on the outer side, that is to say, the separation region 5 in one of the FLRs 2 is formed narrow on the inner peripheral side and wide on the outer peripheral side, so that high withstand voltage is achieved by suppressing the concentration of electric fields at the electric field concentrated points 7, 8, and the resist collapse can also be suppressed.

As shown in FIG. 1, in a case where the one or more separation regions 5 are formed in the FLRs 2 adjacent to each other, it is not preferable that both positions of the separation regions 5 overlap in a direction in which the FLRs 2 extend. The positions overlap, which means that one of the separation regions 5 is further provided at the electric field concentrated point 7 formed by another one of the separation regions 5 in the FLR 2 on the outer side. In this case, the FLR 2 on the inner side does not share the potential, so that electric fields are more concentrated at the electric field concentrated point 7 of the FLR 2 on the further inner side, and thus a semiconductor device having a desired withstand voltage cannot be obtained. As shown in FIG. 1, the separation regions 5 are arranged to be staggered in the FLRs 2 adjacent to each other to prevent an excessive concentration of electric fields, and thus a semiconductor device having high withstand voltage can be obtained.

As shown in FIGS. 1 and 2, the resists 4 have a sufficiently great line width toward the outer periphery of the terminal region 120 including the FLRs 2 at sufficiently wide intervals, thereby lowering the possibility that the resist collapses. In this case, the separation regions 5 are provided on the inner side of the terminal region 120 including the FLRs 2 at close intervals, and the separation regions 5 may be omitted on the outer side of the terminal region 120 including the FLRs 2 at the wide intervals.

<B-3. Modification>

Figure 6:
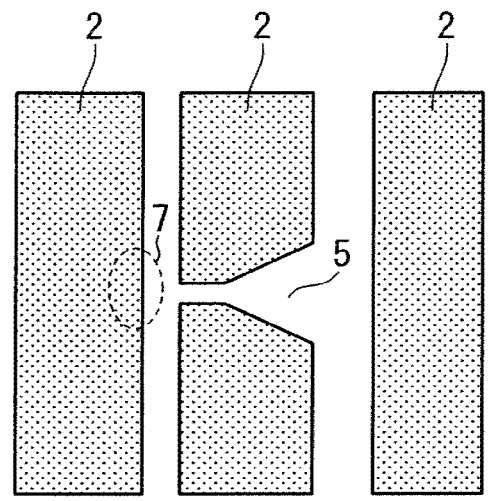
FIG. 6 is a plan view showing an FLR structure of a modification of the first embodiment.

FIG. 4 shows the shape of one of the separation regions 5 having the width increased at the fixed rate from the inner peripheral side toward the outer peripheral side of one of the FLRs 2, as an example of the separation region 5 formed to be narrow on the inner peripheral side and wide on the outer peripheral side of the FLR 2. As shown in FIG. 6, however, the separation region 5 may have a shape such that a width is increased at a fixed rate toward the outer peripheral side after a fixed width is maintained on the inner peripheral side of the FLR 2. This shape allows the separation region 5 to have the same size of the width on the outer peripheral side of the FLR 2 and have the smaller width near the inner peripheral side of the FLR 2 than that of the separation region 5 shown in FIG. 4. This prevents the resist collapse and also suppresses an abrupt potential gradient near the inner peripheral side of the FLR 2 including the separation region 5 having the narrowest width to suppress the concentration of electric fields at the electric field concentrated point 7, and thus a semiconductor device having high withstand voltage can be obtained.

Figure 7:
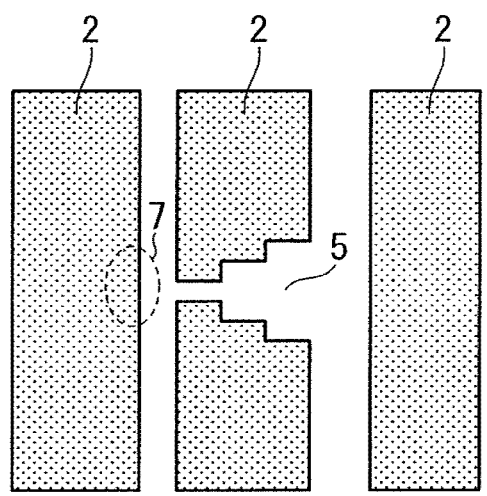
FIG. 7 is a plan view showing the FLR structure of the modification of the first embodiment.

As shown in FIG. 7, a plurality of regions are provided such that the separation region 5 has a fixed width, and the separation region 5 may have a width increased in a step shape from the inner peripheral side toward the outer peripheral side of the FLR 2. This shape allows the separation region 5 to have the same size of the width on the outer peripheral side of the FLR 2 and have the smaller width near the inner peripheral side of the FLR 2 than that of the separation region 5 shown in FIG. 4. This prevents the resist collapse and also suppresses the abrupt potential gradient near the inner peripheral side of the FLR 2 including the separation region 5 having the narrowest width to further suppress the concentration of electric fields at the electric field concentrated point 7, and thus a semiconductor device having high withstand voltage can be obtained. In addition, FIG. 7 shows that each of the regions being the separation region 5 having the fixed width has the same length (in a horizontal direction in FIG. 7) and an amount of change in the step shape is equivalent to each of the steps, but these can be modified as appropriate.

Figure 8:
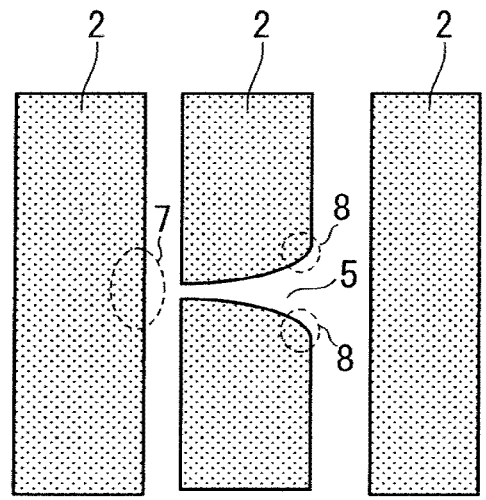
FIG. 8 is a plan view showing the FLR structure of the modification of the first embodiment.

As shown in FIG. 8, a bridge 6 may be curved such that an amount of increase in the width of the separation region 5 is successively increased from the inner peripheral side toward the outer peripheral side of one of the FLRs 2, to thereby form the FLR 2. This shape allows the separation region 5 to have the same size of the width on the outer peripheral side of the FLR 2 and have the smaller width near the inner peripheral side of the FLR 2 than that of the separation region 5 shown in FIG. 4. This prevents the resist collapse and also suppresses the abrupt potential gradient near the inner peripheral side of the FLR 2 including the separation region 5, and thus the concentration of electric fields at the electric field concentrated point 7 can be further suppressed. Moreover, the separation region 5 has a great angle at the end portion on the outer peripheral side of the FLR 2, so that a curvature of equipotential lines at the electric field concentrated points 8 is more reduced than that in FIGS. 4, 6, and 7, and thus the concentration of electric fields at the electric field concentrated points 8 can be further suppressed.

<B-4. Effects>

The semiconductor device of the first embodiment includes the semiconductor element formed in the semiconductor layer 1 (semiconductor substrate made of a wide bandgap semiconductor) of the first conductivity type and the plurality of FLRs 2 (ring-shaped regions) of the second conductivity type formed in the semiconductor layer 1 while surrounding the semiconductor element in plan view. At least one of the plurality of FLRs 2 includes the one or more separation regions 5 of the first conductivity type that cause the inner side and the outer side of one of the FLR 2 to communicate with each other in plan view. The resists 4 for forming the FLRs 2 are joined by the bridges corresponding to the separation regions 5, so that the resist collapse during manufacturing can be suppressed even in a case where the resists 4 have the thin line width. This allows the FLRs 2 to be disposed at close intervals on the inner side of the terminal region 120, and the concentration of electric fields in the terminal region can be effectively relieved.

In the semiconductor device in the first embodiment, in the case where the one or more separation regions 5 are formed in the FLRs 2 adjacent to each other, both the positions of the separation regions 5 do not overlap in the direction in which the FLRs 2 extend. This prevents an excessive concentration of electric fields, and a semiconductor device having high withstand voltage can be obtained.

In the semiconductor device in the first embodiment, the separation region 5 has the width increased from the inner peripheral side toward the outer peripheral side of the FLR 2, so that the concentration of electric fields at the electric field concentrated points 7, 8 can be relieved.

In the semiconductor device in the first embodiment, the separation region 5 may include the region having the fixed width on the inner peripheral side of the FLR 2. In this manner, the separation region 5 can have the narrow width on the inner peripheral side of the FLR 2, which prevents the resist collapse and also suppresses the abrupt potential gradient near the inner peripheral side of the FLR 2 including the separation region 5 having the narrowest width to suppress the concentration of electric fields at the electric field concentrated point 7. Thus, a semiconductor device having high withstand voltage can be obtained.

In the semiconductor device in the first embodiment, the separation region 5 may have the width in the step shape increased from the inner peripheral side toward the outer peripheral side of the FLR 2. In this manner, the separation region 5 can have the small width on the inner peripheral side of the FLR 2, which prevents the resist collapse and also suppresses the abrupt potential gradient near the inner peripheral side of the FLR 2 including the separation region 5 having the narrowest width to further suppress the concentration of electric fields at the electric field concentrated point 7. Thus, a semiconductor device having high withstand voltage can be obtained.

In the semiconductor device in the first embodiment, the amount of increase in the width of the separation region 5 may be successively increased from the inner peripheral side toward the outer peripheral side of the FLR 2. In this manner, the separation region 5 can have the small width on the inner peripheral side of the FLR 2, which prevents the resist collapse and also suppresses the abrupt potential gradient near the inner peripheral side of the FLR 2 including the separation region 5. Thus, the concentration of electric fields at the electric field concentrated point 7 can be further suppressed. Moreover, the separation region 5 has the great angle at the end portion on the outer peripheral side of the FLR 2, so that the curvature of the equipotential lines at the electric field concentrated points 8 is reduced, and thus the concentration of electric fields at the electric field concentrated points 8 can be further suppressed.

To improve withstand voltage of a semiconductor device, the FLRs 2 particularly on the inner peripheral side need to be disposed at close intervals, and in a case where a silicon carbide semiconductor substrate is used for the semiconductor substrate 1 of the semiconductor device in the first embodiment, the resists 4 need to have a narrow line width to dispose the FLRs 2 at the close intervals since a diffusion of an impurity is reduced in silicon carbide. When the resists 4 have the narrow line width, a desired withstand voltage may not normally be obtained due to the resist collapse. However, the configuration of the present invention can suppress the resist collapse when the FLRs 2 are formed even in the case where the resists 4 have the narrow line width. Thus, the concentration of electric fields in the terminal region 120 is effectively relieved, and a semiconductor device having higher withstand voltage can be obtained.

The resist collapse hardly occurs in regions having a curvature, such as four corner portions in a semiconductor device, and the resist collapse mainly occurs in linear portions. For this reason, the bridges 6 may be provided only in the linear portions of the resists 4, and the separation regions 5 may be disposed only in the linear portions of the FLRs 2.

An impurity concentration when the FLRs 2 are formed has a great influence on withstand voltage of the terminal region. For a low impurity concentration, potential distribution is unstable due to disturbance factors such as a fixed charge, thereby easily lowering withstand voltage. For a great impurity concentration, potential distribution is stable, but a concentration of electric fields is great in rings close to the outer side, thereby lowering withstand voltage. In a case where the separation regions 5 are provided as in the present invention, the rings close to the further inner side share a potential for a great amount of implantation, so that a semiconductor device capable of maintaining high withstand voltage with stability can be obtained.

The method for manufacturing the semiconductor device of the first embodiment includes: (a) forming the active region 110 (semiconductor element) in the semiconductor layer 1 (semiconductor substrate made of a wide bandgap semiconductor) of the first conductivity type; and (b) forming the plurality of FLRs 2 at locations surrounding the active region 110 in the semiconductor layer 1 in plan view. The (b) forming the plurality of FLRs 2 includes: (b1) forming the plurality of resists 4 of the ring shape on the semiconductor layer 1 surrounding the active region 110 in plan view such that the plurality of resists 4 are separated from each other and such that at least one of the resists 4 is joined to another one of the resists 4 adjacent to the at least one resist 4 by the bridge 6 having a predetermined width; and (b2) implanting ions into the semiconductor layer 1 using the resists 4 as a mask. The resists 4 are joined by the bridge 6, so that the resist collapse can be suppressed even in the case where the resists 4 have the thin line width. This allows the FLRs 2 to be disposed at close intervals on the inner side of the terminal region 120, and the concentration of electric fields in the terminal region is effectively relieved. Thus, a semiconductor device having high withstand voltage can be manufactured.

C. Second Embodiment

<C-1. Configuration>

Figure 9:
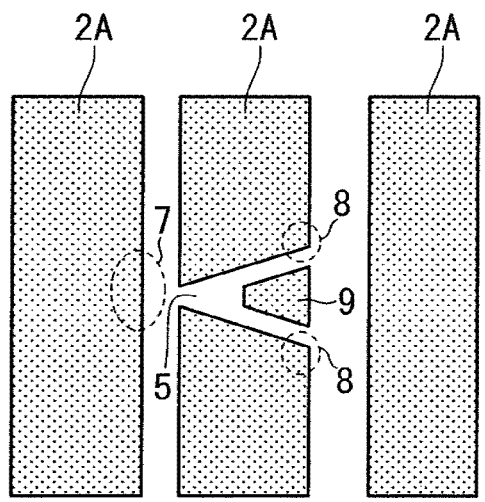
FIG. 9 is a plan view showing an FLR structure of a second embodiment.

FIG. 9 shows FLRs 2A in a terminal structure of a Schottky diode being a semiconductor device in a second embodiment. The Schottky diode in the second embodiment is similar to the FLRs 2 in the first embodiment shown in FIG. 4, except that the Schottky diode includes a block region 9 of the p-type on an outer peripheral side of one of the FLRs 2A in a separation region 5, the block region 9 being isolated from the other portions of the FLR 2A.

Figure 10:
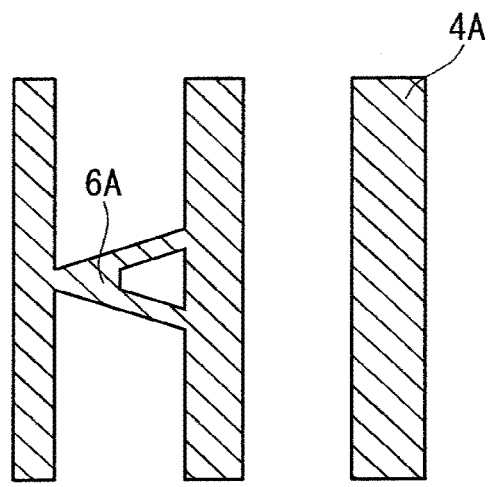
FIG. 10 is a plan view showing a step for manufacturing the FLR structure of the second embodiment.

FIG. 10 shows resists 4A for forming the FLRs 2A. An opening for forming the block region 9 is formed in the resists 4A. Consequently, a bridge 6A of the resists 4A joins the resist 4A on the inner side in one place on the inner side and joins the resist 4A on the outer side in two places on the outer side. The resists 4A adjacent to each other are joined by the bridge 6A, which suppresses the resist collapse.

The block region 9 holds a potential, thereby suppressing the concentration of electric fields at the electric field concentrated points 7, 8 more effectively than the FLRs 2 in the first embodiment shown in FIG. 4. Thus, a semiconductor device having high withstand voltage can be obtained.

Figure 11:
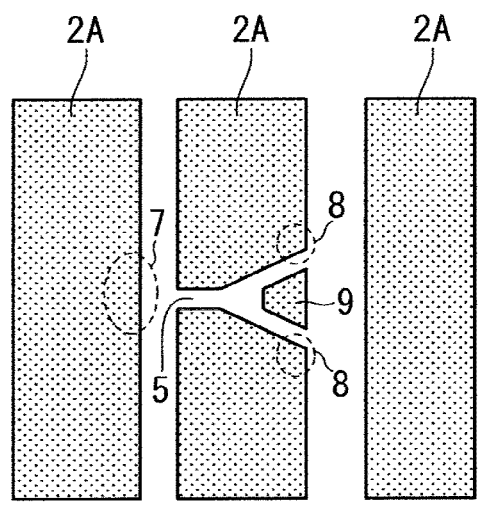
FIG. 11 is a plan view showing the FLR structure of the second embodiment.

The modification described in the first embodiment is also applicable to the second embodiment. FIG. 11 shows FLRs 2A in which the modification of the first embodiment shown in FIG. 6 is applied to the second embodiment. The FLRs 2A in FIG. 11 can reduce the width of the separation region 5 near the inner peripheral side of one of the FLRs 2A more than that in the FLR 2A shown in FIG. 9 while the separation region 5 has the same size of the width on the outer peripheral side of the FLR 2A. Thus, in addition to the effects of the FLRs 2A shown in FIG. 9, an abrupt potential gradient near the inner peripheral side of the FLR 2 including the separation region 5 having the narrowest width is suppressed to suppress the concentration of electric fields at the electric field concentrated point 7, and thus a semiconductor device having high withstand voltage can be obtained.

<C-2. Effects>

The semiconductor device in the second embodiment includes the block region 9 of the second conductivity type on the outer peripheral side of one of the FLRs 2A (ring-shaped regions) in the separation region 5, the block region 9 being isolated from the FLR 2A. The resists 4A for forming the FLRs 2A are joined by the bridge 6A corresponding to the separation region 5, so that the resist collapse during manufacturing can be suppressed even in the case where the resists 4A have the thin line width. This allows the FLRs 2A to be disposed at close intervals on the inner side of the terminal region 120, and the concentration of electric fields in the terminal region 120 can be effectively relieved. The block region 9 holds a potential, thereby effectively suppressing the concentration of electric fields at the electric field concentrated points 7, 8, and thus a semiconductor device having high withstand voltage can be obtained.

D. Third Embodiment

<D-1. Configuration>

Figure 12:
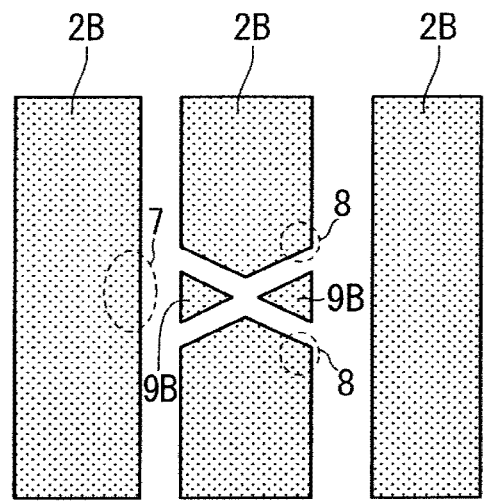
FIG. 12 is a plan view showing an FLR structure of a third embodiment.

FIG. 12 shows FLRs 2B in a terminal structure of a Schottky diode being a semiconductor device in a third embodiment. The Schottky diode in the third embodiment includes two block regions 9B of the p-type each on an inner peripheral side and an outer peripheral side of one of the FLRs 2B in a separation region 5, the block regions 9B separated from each other being isolated from the other portions of the FLR 2B.

Figure 13:
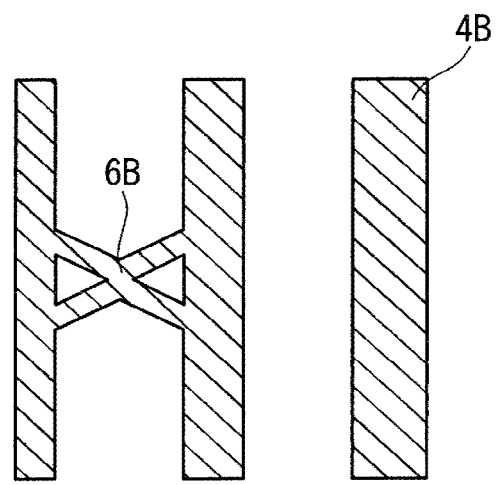
FIG. 13 is a plan view showing a step for manufacturing the FLR structure of the third embodiment.

FIG. 13 shows resists 4B for forming the FLRs 2B. An opening for forming the block regions 9B is formed in the resists 4B. Consequently, bridges 6B of the resists 4B intersect each other, join the resist 4B on the inner side in two places on the inner side, and join the resist 4B on the outer side in two places on the outer side. The resists 4B adjacent to each other are joined by the bridges 6B, which suppresses the resist collapse.

The block regions 9B hold a potential, thereby suppressing the concentration of electric fields at the electric field concentrated points 7, 8 more effectively than the FLRs 2 in the first embodiment shown in FIG. 4. Thus, a semiconductor device having high withstand voltage can be obtained.

Figure 14:
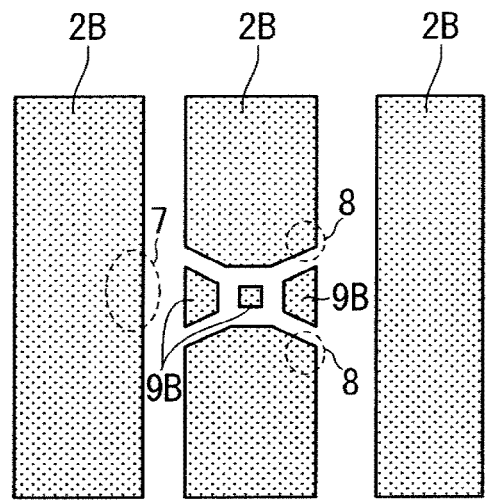
FIG. 14 is a plan view showing the FLR structure of the third embodiment.

As shown in FIG. 14, three or more block regions 9B of the p-type may be provided to be separated from each other, the block regions 9B being isolated from the other portions of one of the FLRs 2B. A semiconductor device shown in FIG. 14 includes the three block regions 9B of the p-type from the inner peripheral side toward the outer peripheral side of the FLR 2B in the separation region 5, the block regions 9B separated from each other being isolated from the other portions of the FLR 2B.

Figure 15:
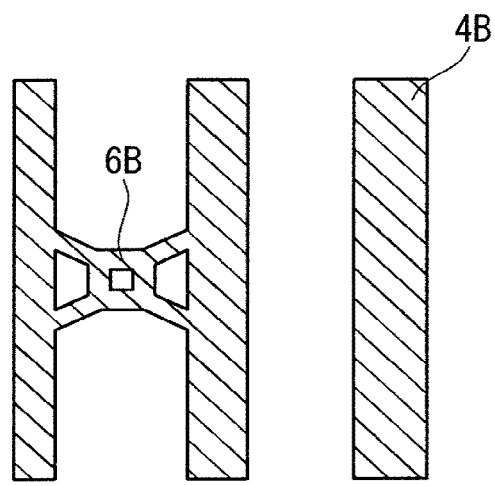
FIG. 15 is a plan view showing a step for manufacturing the FLR structure of the third embodiment.

FIG. 15 shows resists 4B for forming the FLRs 2B. An opening for forming the block regions 9B is formed in the resists 4B. Consequently, bridges 6B of the resists 4B intersect in a plurality of places, join the resist 4B on the inner side in two places on the inner side, and join the resist 4B on the outer side in two places on the outer side. The resists 4B adjacent to each other are joined by the bridges 6B, which suppresses the resist collapse.

<D-2. Effects>

The semiconductor device in the third embodiment includes the plurality of block regions 9B of the second conductivity type in one of the FLRs 2B (ring-shaped regions) in the separation region 5, the block regions 9B being isolated from the FLR 2B. The resists 4B for forming the FLRs 2B are joined by the bridges 6B corresponding to the separation region 5, so that the resist collapse during manufacturing can be suppressed even in the case where the resists 4B have the thin line width. This allows the FLRs 2B to be disposed at close intervals on the inner side of the terminal region 120, and the concentration of electric fields in the terminal region 120 can be effectively relieved. The block regions 9B hold a potential, thereby effectively suppressing the concentration of electric fields at the electric field concentrated points 7, 8, and thus a semiconductor device having high withstand voltage can be obtained.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. The present invention is not restricted to the material quality, the materials, the execution conditions and the like of the respective components which are described, for example. It is therefore understood the numerous modifications and variations can be devised without departing from the scope of the invention.

DESCRIPTION OF NUMERALS 1 semiconductor layer; 2, 20, 21, 2A, 2B FLR; 3 metal electrode; 4, 40, 4A resist; 5, 5A separation region; 6, 6A bridge; 7, 8 electric field concentrated point; 9, 9B block region; 100, 101 Schottky diode; 110 active region; 120, 121 terminal region.

The invention claimed is:

1. A semiconductor device, comprising:
   a semiconductor element formed in a semiconductor substrate comprising a silicon carbide semiconductor of a first conductivity type; and
   a plurality of ring-shaped regions of a second conductivity type formed in said semiconductor substrate while surrounding said semiconductor element in plan view,
   wherein at least one of said plurality of ring-shaped regions includes one or more separation regions of the first conductivity type that cause areas of the first conductivity type on an inner side and an outer side of one of said ring-shaped regions to communicate with each other via the separation region of the first conductivity type in plan view.

2. The semiconductor device according to claim 1, wherein in a case where said one or more separation regions are formed in said ring-shaped regions adjacent to each other, both positions of said separation regions do not overlap in a direction in which said ring-shaped regions extend.

3. The semiconductor device according to claim 1, wherein said one or more separation regions have a width increased from an inner peripheral side toward an outer peripheral side.

4. The semiconductor device according to claim 3, wherein said one or more separation regions include a region having a fixed width on the inner peripheral side of one of said ring-shaped regions.

5. The semiconductor device according to claim 3, wherein said one or more separation regions have a width increased in a step shape from the inner peripheral side toward the outer peripheral side of one of said ring-shaped regions.

6. The semiconductor device according to claim 3, wherein an amount of increase in the width of said one or more separation regions is successively increased from the inner peripheral side toward the outer peripheral side of one of said ring-shaped regions.

7. The semiconductor device according to claim 3, comprising a block region of the second conductivity type on the outer peripheral side of one of said ring-shaped regions in said one or more separation regions, said block region being isolated from one of said ring-shaped regions.

8. The semiconductor device according to claim 1, comprising one or more block regions of the second conductivity type in one of said ring-shaped regions in said one or more separation regions, said block regions being isolated from one of said ring-shaped regions.

9. A method for manufacturing a semiconductor device, comprising:
   (a) forming a semiconductor element in a semiconductor substrate comprising a silicon carbide semiconductor of a first conductivity type; and
   (b) forming a plurality of ring-shaped regions at locations surrounding said semiconductor element in said semiconductor substrate in plan view,
   wherein said (b) forming a plurality of ring-shaped regions includes:
   (b1) forming a plurality of resists of a ring shape on said semiconductor substrate surrounding said semiconductor element in plan view such that said plurality of resists are separated from each other and such that at least one of said resists is joined to another one of said resists adjacent to said at least one resist by a bridge having a predetermined width; and
   (b2) implanting ions into said semiconductor substrate using said resists as a mask.

* * * * *